(12) United States Patent
Jou et al.

(10) Patent No.: US 10,670,816 B2
(45) Date of Patent: Jun. 2, 2020

(54) POLYMER-BASED 1 X 2 VERTICAL OPTICAL SPLITTERS ON SILICON SUBSTRATE

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/964,701

(22) Filed: Apr. 27, 2018

(65) Prior Publication Data

US 2018/0335590 A1   Nov. 22, 2018

Related U.S. Application Data

(60) Provisional application No. 62/508,940, filed on May 19, 2017, provisional application No. 62/509,892, filed on May 23, 2017.

(51) Int. Cl.
   *G02B 6/42*      (2006.01)
   *G02B 6/122*     (2006.01)
   (Continued)

(52) U.S. Cl.
   CPC ........ *G02B 6/4214* (2013.01); *G02B 6/12011* (2013.01); *G02B 6/1221* (2013.01);
   (Continued)

(58) Field of Classification Search
   CPC .. G02B 6/4214; G02B 6/4279; G02B 6/4274; G02B 6/4201; G02B 6/4203
   See application file for complete search history.

(56) References Cited

U.S. PATENT DOCUMENTS 5,282,080 A   1/1994   Scifres et al.
5,416,861 A   5/1995   Koh et al.
(Continued)

FOREIGN PATENT DOCUMENTS

WO   WO 2018/213035 A1   11/2018
WO   WO 2018/213036 A1   11/2018
(Continued)

OTHER PUBLICATIONS

Chen et al., "Chip-Level 1 2 Optical Interconnects Using Polymer Vertical Splitter on Silieuri Substrate," IEEE Photonics Journal, 6:1-9 (2014).[ Retrieved from the Internet on Jun. 29, 2018 >URL: https://ieeexplore.ieee.org/stamp/stamp.jsp?tp=&arnumber=67.
(Continued)

*Primary Examiner* — John Bedtelyon
(74) *Attorney, Agent, or Firm* — Alston & Bird LLP

(57) ABSTRACT

The application discloses a polymer-based optical splitter on a silicon surface. A trench is formed on the silicon surface and a polymer waveguide having three 45 degree reflectors is patterned in the trench. The trench has two slanted side walls opposite to each other. Two reflectors of the polymer waveguide are arranged on the two slanted side walls. An intrusion structure with a slanted front wall is located in the middle of the waveguide and the third reflector is formed on the slanted front wall. The first reflector receives an optical input source, the second reflector is aligned to return light to the end optical receiver. The third reflector functions as a light splitter and is aligned to an intermediate optical receiver. Light splitting ratio is determined by the third reflector size relative to the waveguide cross section near the third reflector. A fabrication method is disclosed thereof.

19 Claims, 10 Drawing Sheets

(51) Int. Cl.
*G02B 6/12* (2006.01)
*G02B 6/36* (2006.01)
*H01S 5/183* (2006.01)
*H01S 5/022* (2006.01)
*H05K 1/02* (2006.01)
*H05K 1/18* (2006.01)
*H04B 10/25* (2013.01)
*H04B 10/67* (2013.01)
*H04B 10/50* (2013.01)
*H04J 14/02* (2006.01)

(52) U.S. Cl.
CPC .......... *G02B 6/3652* (2013.01); *G02B 6/425* (2013.01); *G02B 6/4206* (2013.01); *G02B 6/428* (2013.01); *G02B 6/4212* (2013.01); *G02B 6/4259* (2013.01); *G02B 6/4279* (2013.01); *H01S 5/183* (2013.01); *H04B 10/25* (2013.01); *H04B 10/67* (2013.01); *H05K 1/0274* (2013.01); *G02B 6/421* (2013.01); *H01S 5/02284* (2013.01); *H01S 5/02292* (2013.01); *H04B 10/506* (2013.01); *H04J 14/02* (2013.01); *H05K 1/189* (2013.01); *H05K 2201/10121* (2013.01); *H05K 2201/10151* (2013.01)

(56) References Cited

U.S. PATENT DOCUMENTS

| | | |
|---|---|---|
| 5,446,814 A | 8/1995 | Kuo et al. |
| 5,485,021 A | 1/1996 | Abe |
| 5,956,603 A | 9/1999 | Talwar et al. |
| 6,036,956 A | 3/2000 | Jacob et al. |
| 6,049,639 A | 4/2000 | Paniccia et al. |
| 6,052,498 A | 4/2000 | Paniccia |
| 6,243,508 B1 | 6/2001 | Jewell et al. |
| 6,330,377 B1 | 12/2001 | Kosemura |
| 6,393,169 B1 | 5/2002 | Paniccia et al. |
| 6,403,393 B1 | 6/2002 | Adkisson et al. |
| 6,456,765 B1 | 9/2002 | Klocek et al. |
| 6,549,708 B2 | 4/2003 | Worchesky et al. |
| 6,587,605 B2 | 7/2003 | Paniccia et al. |
| 6,603,915 B2 | 8/2003 | Glebov et al. |
| 6,731,856 B1 | 5/2004 | Fujita et al. |
| 6,845,184 B1 | 1/2005 | Yoshimura et al. |
| 6,996,303 B2 | 2/2006 | Glebov et al. |
| 7,218,809 B2 | 5/2007 | Zhou et al. |
| 7,266,262 B2 | 9/2007 | Ogawa |
| 7,529,439 B2 | 5/2009 | Kim et al. |
| 7,627,204 B1 | 12/2009 | Deane |
| 8,135,248 B2 | 3/2012 | Hodono |
| 8,368,995 B2 | 2/2013 | Dallesasse et al. |
| 9,036,956 B2 | 5/2015 | Tseng et al. |
| 9,086,551 B2 * | 7/2015 | Heroux ............... G02B 6/4215 |
| 9,310,575 B2 | 4/2016 | Matsuda |
| 9,341,797 B2 | 5/2016 | Nakagawa et al. |
| 9,627,851 B1 | 4/2017 | Zilkie |
| 9,939,593 B2 | 4/2018 | Miao et al. |
| 9,964,702 B1 | 5/2018 | Luo et al. |
| 2001/0031109 A1 | 10/2001 | Paniccia et al. |
| 2001/0038737 A1 | 11/2001 | Imada et al. |
| 2002/0018507 A1 | 2/2002 | Deacon |
| 2002/0028045 A1 | 3/2002 | Yoshimura et al. |
| 2002/0036356 A1 | 3/2002 | Teshima |
| 2002/0114587 A1 | 8/2002 | Golwalkar et al. |
| 2003/0015770 A1 | 1/2003 | Talin et al. |
| 2003/0223673 A1 | 12/2003 | Garito et al. |
| 2004/0065843 A1 | 4/2004 | Schut et al. |
| 2004/0109654 A1 | 6/2004 | Feger et al. |
| 2004/0245538 A1 | 12/2004 | Wang et al. |
| 2004/0264837 A1 | 12/2004 | Ogawa |
| 2005/0031265 A1 | 2/2005 | Simon et al. |
| 2005/0041906 A1 | 2/2005 | Sugama et al. |
| 2005/0063636 A1 | 3/2005 | Joyner |
| 2005/0136574 A1 | 6/2005 | Shih et al. |
| 2005/0141808 A1 | 6/2005 | Cheben et al. |
| 2005/0185900 A1 | 8/2005 | Farr |
| 2005/0201707 A1 | 9/2005 | Glebov |
| 2006/0045418 A1 | 3/2006 | Cho et al. |
| 2007/0058976 A1 | 3/2007 | Tatum et al. |
| 2008/0031583 A1 | 2/2008 | Ohtsu et al. |
| 2008/0037934 A1 | 2/2008 | Daikuhara et al. |
| 2008/0130125 A1 | 6/2008 | Goelles et al. |
| 2008/0265416 A1 | 10/2008 | Lee et al. |
| 2008/0279557 A1 | 11/2008 | Park et al. |
| 2008/0279566 A1 | 11/2008 | Miller et al. |
| 2009/0049964 A1 | 2/2009 | Yagyu et al. |
| 2009/0060526 A1 | 3/2009 | Matsui et al. |
| 2009/0072393 A1 | 3/2009 | Bachman |
| 2009/0202713 A1 | 8/2009 | Pitwon |
| 2009/0218519 A1 | 9/2009 | McLeod |
| 2010/0032853 A1 | 2/2010 | Naitou |
| 2010/0104290 A1 | 4/2010 | Nobuhara et al. |
| 2010/0213561 A1 | 8/2010 | Assefa et al. |
| 2010/0215313 A1 | 8/2010 | Matsuoka et al. |
| 2010/0226655 A1 | 9/2010 | Kim |
| 2011/0030778 A1 | 2/2011 | Takacs et al. |
| 2011/0133063 A1 | 6/2011 | Ji et al. |
| 2011/0229080 A1 | 9/2011 | Bulthuis et al. |
| 2012/0076454 A1 | 3/2012 | Shiraishi |
| 2012/0163821 A1 | 6/2012 | Kwon et al. |
| 2012/0177381 A1 | 7/2012 | Dobbelaere et al. |
| 2012/0314990 A1 | 12/2012 | Pitwon et al. |
| 2013/0064494 A1 | 3/2013 | Bolle et al. |
| 2013/0182998 A1 | 6/2013 | Andry et al. |
| 2013/0195456 A1 | 8/2013 | Sorin et al. |
| 2013/0223789 A1 | 8/2013 | Lee |
| 2014/0112616 A1 | 4/2014 | Numata |
| 2014/0140657 A1 | 5/2014 | Shiraishi |
| 2014/0177995 A1 | 6/2014 | Mohammed et al. |
| 2014/0294342 A1 | 10/2014 | Offrein |
| 2014/0321804 A1 | 10/2014 | Thacker et al. |
| 2014/0355931 A1 | 12/2014 | Tummala et al. |
| 2015/0043919 A1 | 2/2015 | Handelman |
| 2015/0117824 A1 | 4/2015 | Wang et al. |
| 2015/0132002 A1 | 5/2015 | Krishnamurthy et al. |
| 2015/0168646 A1 | 6/2015 | Arai |
| 2015/0303649 A1 | 10/2015 | Weber |
| 2015/0333831 A1 * | 11/2015 | Lai ................. H04B 10/50 398/200 |
| 2015/0362673 A1 | 12/2015 | Zheng et al. |
| 2015/0362676 A1 | 12/2015 | Murison et al. |
| 2016/0011414 A1 | 1/2016 | Joseph |
| 2016/0156999 A1 | 6/2016 | Liboiron-Ladouceur et al. |
| 2016/0178839 A1 | 6/2016 | Tsujita |
| 2016/0349451 A1 | 12/2016 | Shen et al. |
| 2017/0017042 A1 | 1/2017 | Menard et al. |
| 2017/0230117 A1 | 8/2017 | Li et al. |
| 2018/0149815 A1 | 5/2018 | Heroux et al. |
| 2018/0159627 A1 | 6/2018 | Fazal et al. |
| 2018/0288875 A1 | 10/2018 | Sasaki et al. |
| 2018/0335583 A1 | 11/2018 | Jou et al. |
| 2018/0335584 A1 | 11/2018 | Jou et al. |
| 2018/0335585 A1 | 11/2018 | Jou et al. |
| 2018/0335586 A1 | 11/2018 | Jou et al. |
| 2018/0335587 A1 | 11/2018 | Jou et al. |
| 2018/0335588 A1 | 11/2018 | Jou et al. |
| 2018/0335589 A1 | 11/2018 | Jou et al. |
| 2018/0337111 A1 | 11/2018 | Jou et al. |
| 2018/0337743 A1 | 11/2018 | Jou et al. |

FOREIGN PATENT DOCUMENTS

| | | |
|---|---|---|
| WO | WO 2018/213037 A1 | 11/2018 |
| WO | WO 2018/213038 A1 | 11/2018 |
| WO | WO 2018/213039 A1 | 11/2018 |
| WO | WO 2018/213040 A1 | 11/2018 |
| WO | WO 2018/213041 A1 | 11/2018 |
| WO | WO 2018/213042 A1 | 11/2018 |

(56) References Cited

FOREIGN PATENT DOCUMENTS

| WO | WO 2018/213043 A1 | 11/2018 |
|----|-------------------|---------|
| WO | WO 2018/213044 A1 | 11/2018 |

OTHER PUBLICATIONS

Shen et al., "Implementation of Chip-Level Optical Interconnect With Laser and Photodetector Using SOI-Based 3-D Guided-Wave Path", IEEE Photonics Journal, 6:1-9, (2014).

Shen et al., "Chip Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/docu.

U.S. Appl. No. 15/963,043, Requirement for Restriction-Election dated Jun. 29, 2018.

U.S. Appl. No. 15/963,440 Requirement for Restriction-Election dated Jul. 10, 2018.

U.S. Appl. No. 15/963,780, Requirement for Restriction-Election dated Jul. 27, 2018.

U.S. Appl. No. 15/964,889, Non-Final Office Action dated Jun. 27, 2018.

WIPO Application No. PCT/US2018/031328, PCT International Search Report and Written Opinion of the International Searching Authority dated Jul. 26, 2018.

WIPO Application No. PCT/US2018/031331, PCT International Search Report and Written Opinion of the International Searching Authority dated Jul. 26, 2018.

WIPO Application No. PCT/US2018/031332, PCT International Search Report and Written Opinion of the International Searching Authority dated Jul. 26, 2018.

WIPO Application No. PCT/US2018/031333, PCT International Search Report and Written Opinion of the International Searching Authority dated Jul. 26, 2018.

WIPO Application No. PCT/US2018/031334, PCT International Search Report and Written Opinion of the International Searching Authority dated Jul. 26, 2018.

WIPO Application No. PCT/US2018/031335, PCT International Search Report and Written Opinion of the International Searching Authority dated Sep. 12, 2018.

WIPO Application No. PCT/US2018/031338, PCT International Search Report and Written Opinion of the International Searching Authority dated Jul. 31, 2018.

WIPO Application No. PCT/US2018/031343, PCT International Search Report and Written Opinion of the International Searching Authority dated Jul. 31, 2018.

WIPO Application No. PCT/US2018/031345, PCT International Search Report and Written Opinion of the International Searching Authority dated Jul. 26, 2018.

U.S. Appl. No. 15/963,030, Non-Final Office Action dated Oct. 17, 2017.

U.S. Appl. No. 15/963,665, Notice of Allowance dated Oct. 3, 2018.

U.S. Appl. No. 15/963,780, Non-Final Office Action dated Oct. 24, 2018.

WIPO Application No. PCT/US2018/031336, PCT International Search Report and Written Opinion of the International Searching Authority dated Sep. 19, 2018.

U.S. Appl. No. 15/963,043, Requirement for Restriction-Election dated Feb. 25, 2019.

U.S. Appl. No. 15/964,889, Notice of Allowance dated Mar. 21, 2019.

Vlasov "Silicon CMOS-Integrated Nano-Photonics for Computer and Data Communications Beyond 100G," IEEE Communications Magazine, 50(2):s67-s72, (2012).

U.S. Appl. No. 15/963,440, Non-Final Office Action dated Dec. 19, 2018.

U.S. Appl. No. 15/964,889, Final Office Action dated Jan. 2, 2019.

U.S. Appl. No. 15/965,213, Non-Final Office Action dated Jan. 14, 2019.

U.S. Appl. No. 15/963,030, Non-Final Office Action dated Oct. 17, 2018.

U.S. Appl. No. 15/963,014, Non-Final Office Action dated Mar. 29, 2019.

U.S. Appl. No. 15/963,014, Notice of Allowance dated Jul. 2, 2019.

U.S. Appl. No. 15/963,030, Final Office Action dated May 15, 2019.

U.S. Appl. No. 15/963,030, Notice of Allowance dated Jul. 16, 2019.

U.S. Appl. No. 15/963,043, Non-Final Office Action dated Jun. 27, 2019.

U.S. Appl. No. 15/963,440, Final Office Action dated Apr. 23, 2019.

U.S. Appl. No. 15/963,440, Non-Final Office Action dated Jun. 6, 2019.

U.S. Appl. No. 15/963,780, Non-Final Office Action dated Apr. 25, 2019.

U.S. Appl. No. 15/963,780, Notice of Allowance dated Sep. 17, 2019.

U.S. Appl. No. 15/963,815, Non-Final Office Action dated Jun. 17, 2019.

U.S. Appl. No. 15/965,213, Notice of Allowance dated Jun. 5, 2019.

U.S. Appl. No. 15/963,440, Final Office Action dated Oct. 3, 2019.

U.S. Appl. No. 15/963,815, Final Office Action dated Oct. 7, 2019.

* cited by examiner

POLYMER-BASED 1 X 2 VERTICAL OPTICAL SPLITTERS ON SILICON SUBSTRATE

CROSS REFERENCE TO RELATED APPLICATIONS

This application claims the benefit of U.S. Provisional Patent Applications No. 62/508,940, titled "OPTICAL COUPLING STRUCTURE" filed on May 19, 2017, and No. 62/509,892, titled "OPTICAL INTERCONNECT MODULES" filed on May 23, 2017, which are incorporated by reference herein in their entirety.

FIELD

Embodiments described herein relate to optical interconnect modules, and more particularly optical sub-assembly systems in optical interconnects.

BACKGROUND

Cloud computing, enterprise networks, and data center networks continue to drive increased bandwidth demand of optical waveguides for metro and long haul wires, and also rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a number of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module includes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, a prism, and a fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves an external lens alignment, adding complexity and energy loss. A less complicated assembly technique is needed to improve efficiency and reduce cost.

SUMMARY

The application discloses an optical splitter module, including: a substrate having a silicon surface; a trench formed on the top silicon surface, wherein the trench comprises a first and a second slanted side walls opposite to each other, and an intrusion structure having a slanted front wall facing the first slanted side wall; a polymer waveguide formed in the trench, wherein the polymer waveguide comprises a first reflector formed on the first slanted side walls, a second reflector formed on the second slanted side wall, and a third reflector formed on the slanted front wall of the intrusion structure, wherein the third reflector blocks partially the polymer waveguide; an insulating layer deposed on the silicon surface outside the trench; a plurality of conductive lines patterned on the insulating layer; a light source device aligned to the first reflector and connected to a first of the plurality of conductive lines; a second optical receiver device aligned to the second reflector and connected to a second of the plurality of conductive lines; and a first optical receiver device aligned to the third reflector on the intrusion structure and connected to a third of the plurality of conductive lines; wherein an optical path comprises a first portion passing from the light source device through the polymer waveguide to the first optical receiver device, via reflection by the first and third reflectors, and a second portion passing from the light source device through the polymer waveguide to the second optical receiver device, via reflection by the first and the second reflectors.

The light splitting ratio received by the first receiver device depends on the size of the third reflector relative to the cross section of the polymer waveguide near the intrusion structure.

Optionally, the polymer waveguide includes a polymer cladding layer disposed on the trench's bottom covering the first and second slanted side walls and the front slanted surface of the intrusion structure, and a polymer core layer disposed on the polymer cladding layer, wherein a refractive index of the polymer cladding layer is lower than a refractive index of the polymer core layer such that total internal reflection occurs when light travels inside the polymer waveguides.

Optionally, the first slanted side wall of the trench has a slanted angle approximately set at 45 degrees to align optically to the light source device, the second slanted side wall of the trench has a slanted angle approximately set at 45 degrees to align optically to the second optical receiver device, and the slanted front wall of the intrusion structure has a slanted angle approximately set at 45 degrees to align optically to the first optical receiver device.

Optionally, the substrate is one of a silicon substrate or a SOI substrate.

Optionally, the polymer waveguide has a width wider near the intrusion structure than away from the intrusion structure.

Optionally, the conductive lines are made of one of tungsten (W), aluminum (Al), copper (Cu), gold (Au), silver (Ag), stainless steel, or an alloy.

The application also discloses a method of fabricating an optical splitter module. The method has the following steps: providing a substrate having an insulating layer on a top surface; forming a trench having an intrusion structure in the middle of the trench; patterning a first and a second slanted side walls of the trench, wherein the first and second slanted sidewalls are opposite to each other; patterning a slanted front surface of the intrusion structure facing the first slanted side wall; forming a polymer waveguide in the trench, comprising: depositing a first polymer cladding layer in the trench covering the first and second slanted side walls, and the slanted front wall of the intrusion structure; depositing a polymer core layer on the first polymer cladding layer. The method patterning the polymer core layer between the first and second slanted side walls to form a first, a second reflectors respectively, and patterning the intrusion structure to form a third reflector, wherein the intrusion structure partially blocks the polymer waveguide; and covering the patterned polymer core layer with a second polymer cladding layer, leaving one opening above each of the first, the second, and the third reflectors; patterning conductive lines in the insulating layer outside the trench; growing solder bumps on conductive lines for flip chip mounting with bond pads; assembling a light source device to align to the first reflector, a first receiver to align to the third reflector of the intrusion structure, and a second receiver to align to the second reflector.

BRIEF DESCRIPTION OF THE DRAWINGS

Having thus described some embodiments in general terms, reference will now be made to the accompanying drawings, which are not necessarily drawn to scale.

Figure 1:
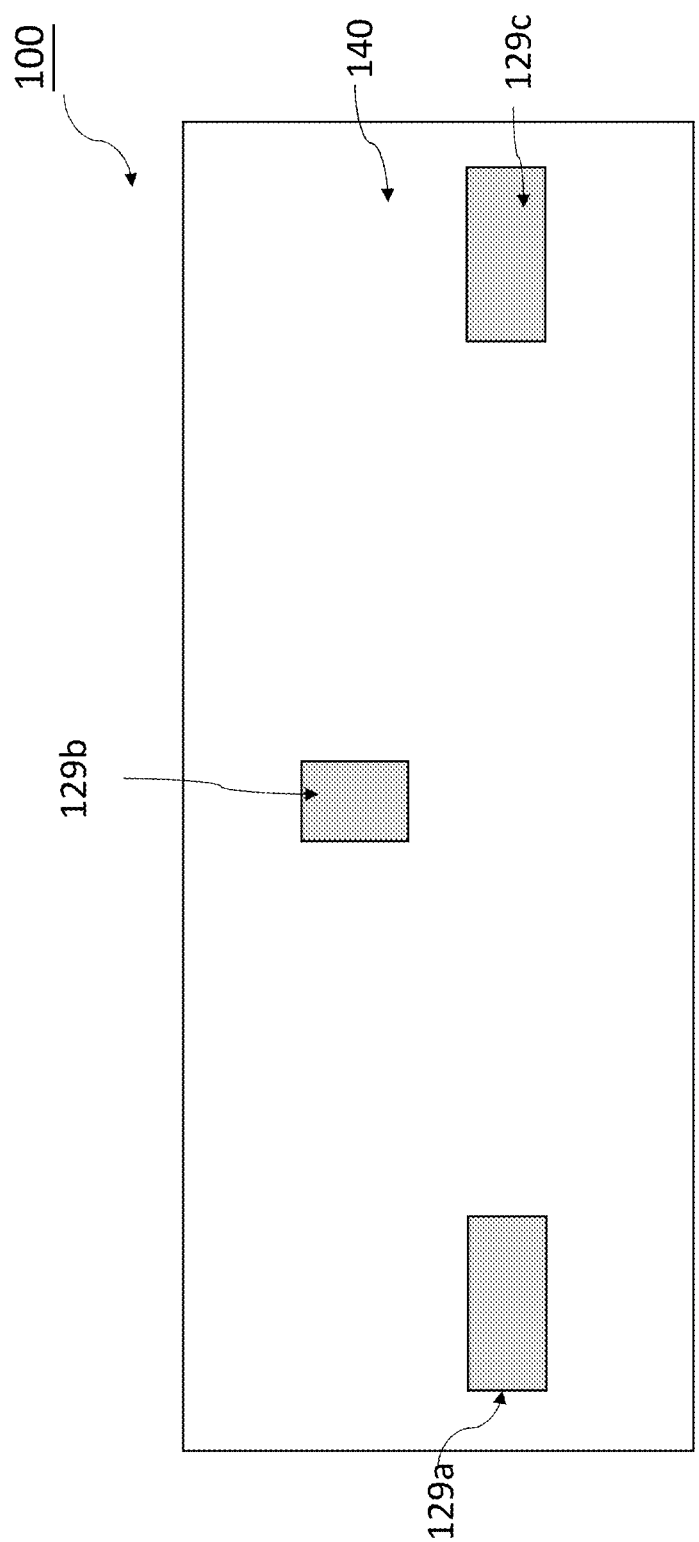

FIG. 1 illustrates a silicon substrate having oxide on top surface in accordance with an embodiment.

Figure 2:
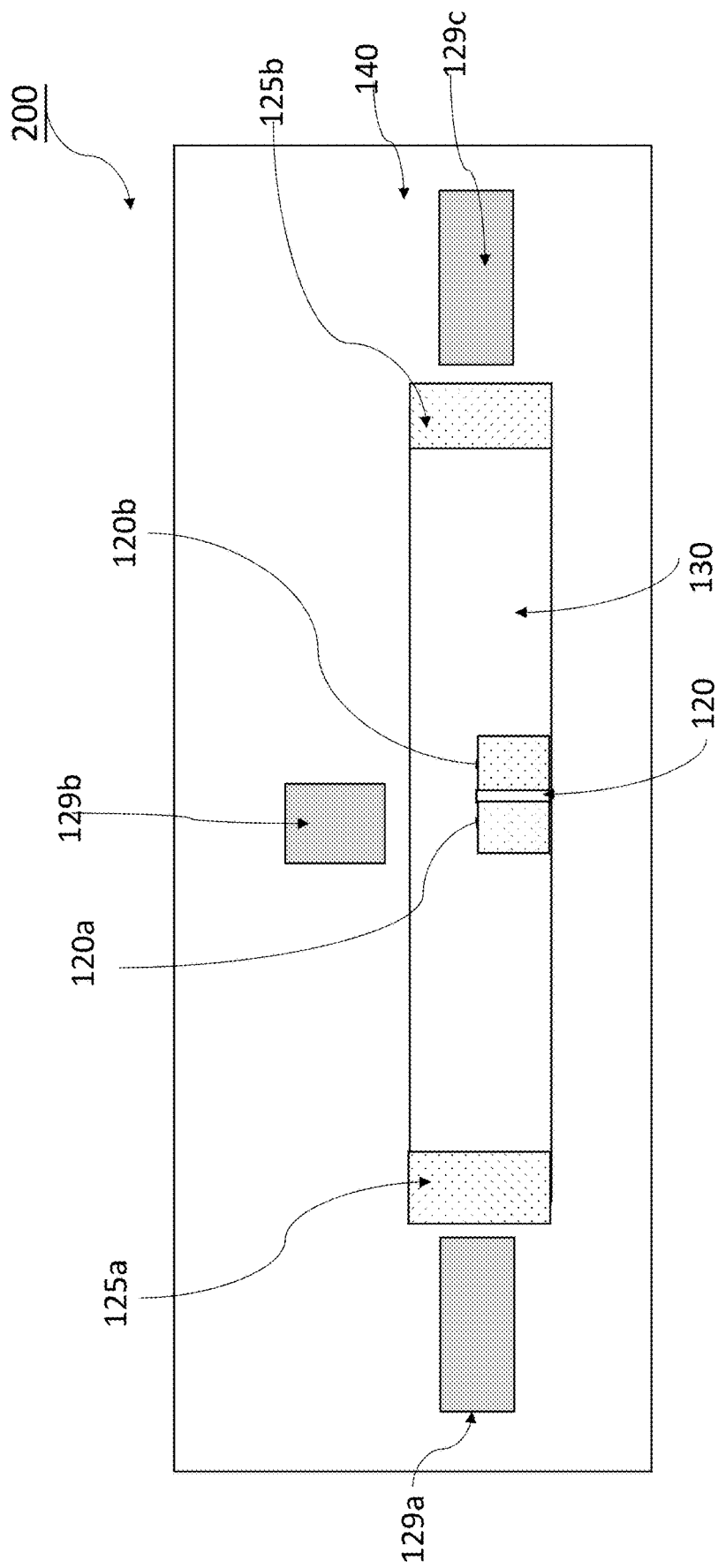

FIG. 2 shows a top view of a trench having two slanted side walls and an upward intrusion structure having one slanted wall made on the silicon substrate in accordance with an embodiment.

Figure 3:
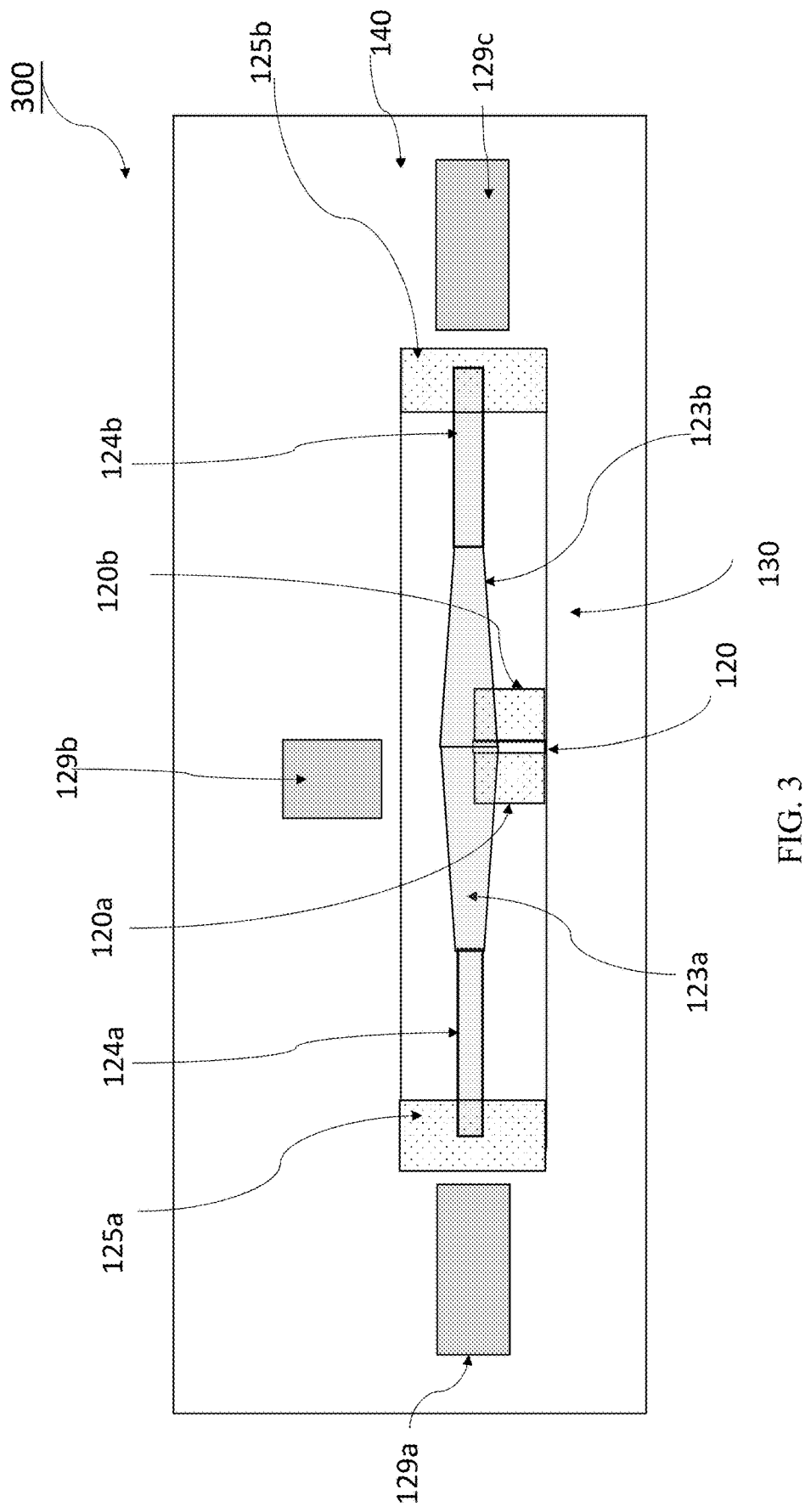

FIG. 3 shows a top view of a polymer waveguide core structure formed in the silicon trench in accordance with an embodiment.

Figure 4:
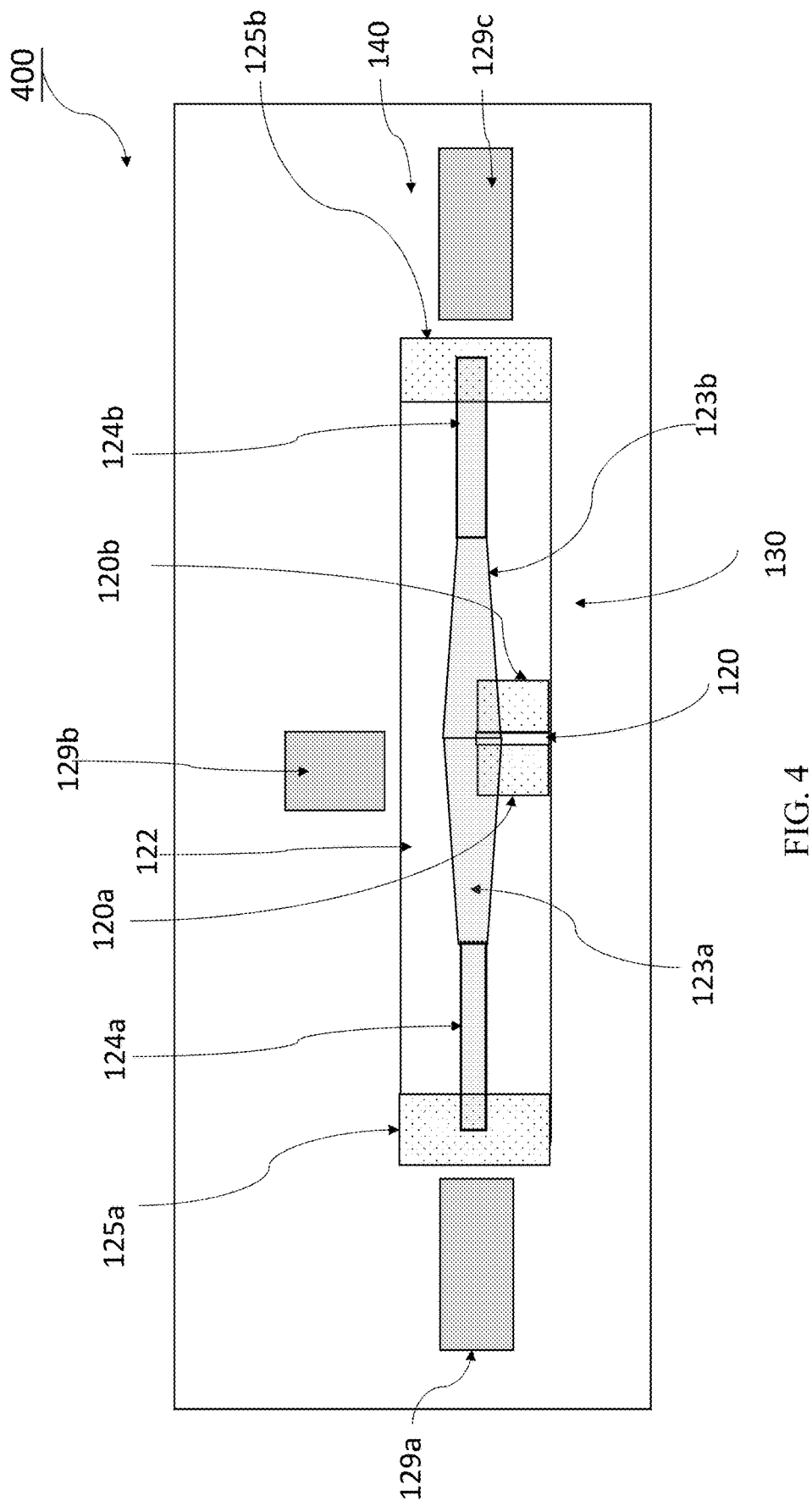

FIG. 4 illustrates a top view of a polymer cladding layer deposited on the polymer waveguide core in the silicon trench in accordance with an embodiment.

Figure 5:
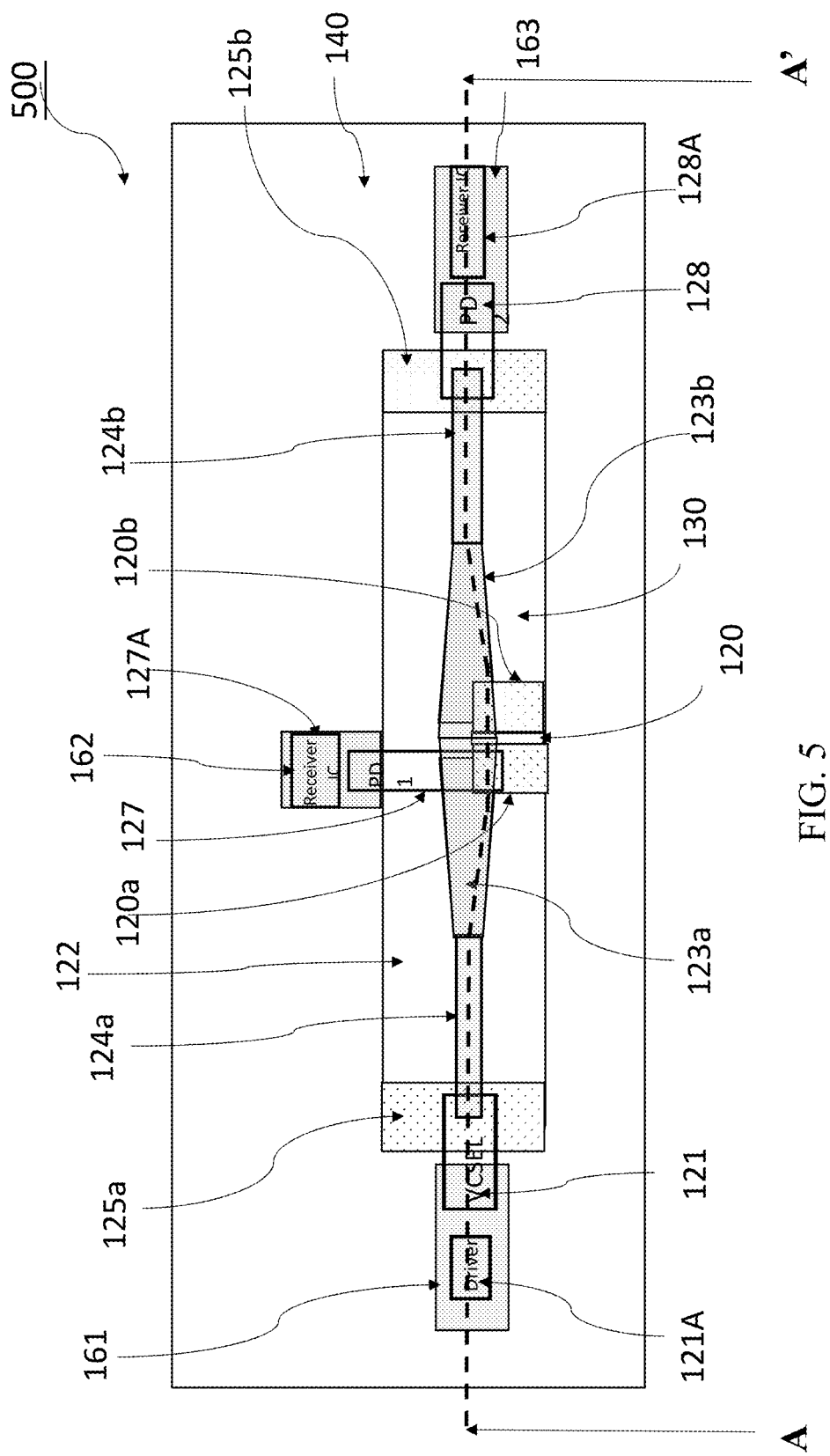

FIG. 5 illustrates a top view of an optical splitter using a polymer waveguide after contact lines and active devices have been fabricated outside the silicon trench, wherein a line AA' is drawn through the intrusion structure in accordance with an embodiment.

Figure 6:
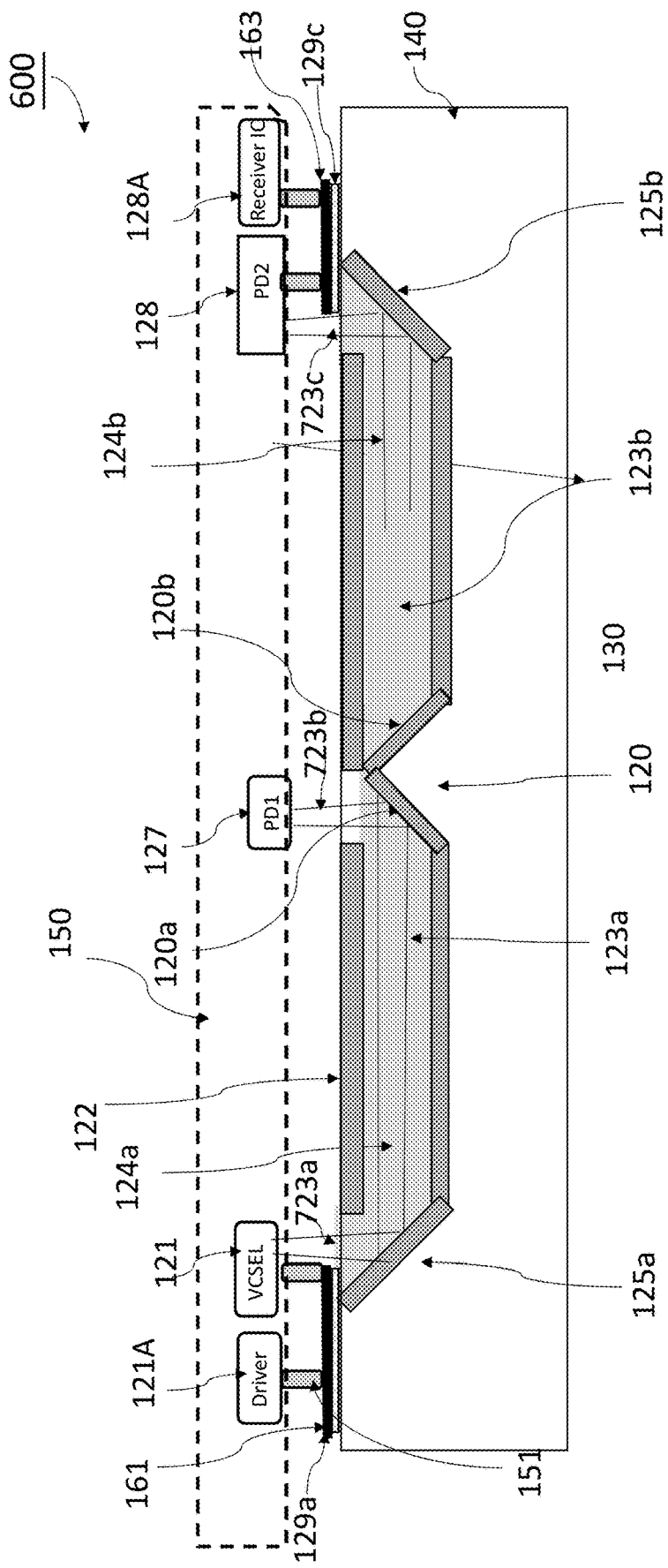

FIG. 6 illustrates a cross sectional view of an optical splitter having a polymer waveguide in the silicon trench along the line AA' in FIG. 5 in accordance with an embodiment.

Figure 7:
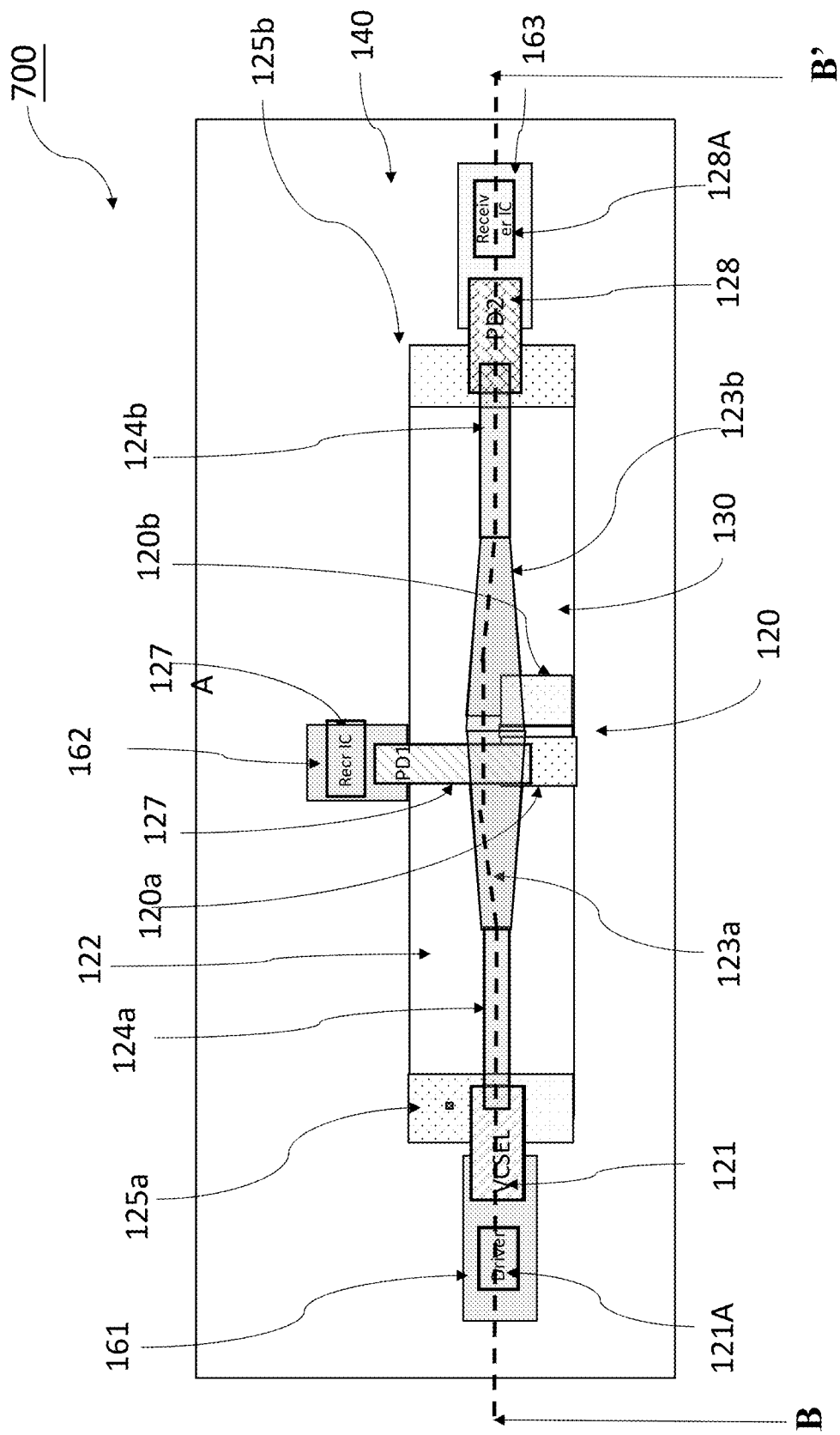

FIG. 7 illustrates a top view of an optical splitter having a polymer waveguide after contact lines and active devices have been fabricated outside the silicon trench, wherein a line BB' drawn outside the intrusion structure in accordance with an embodiment.

Figure 8:
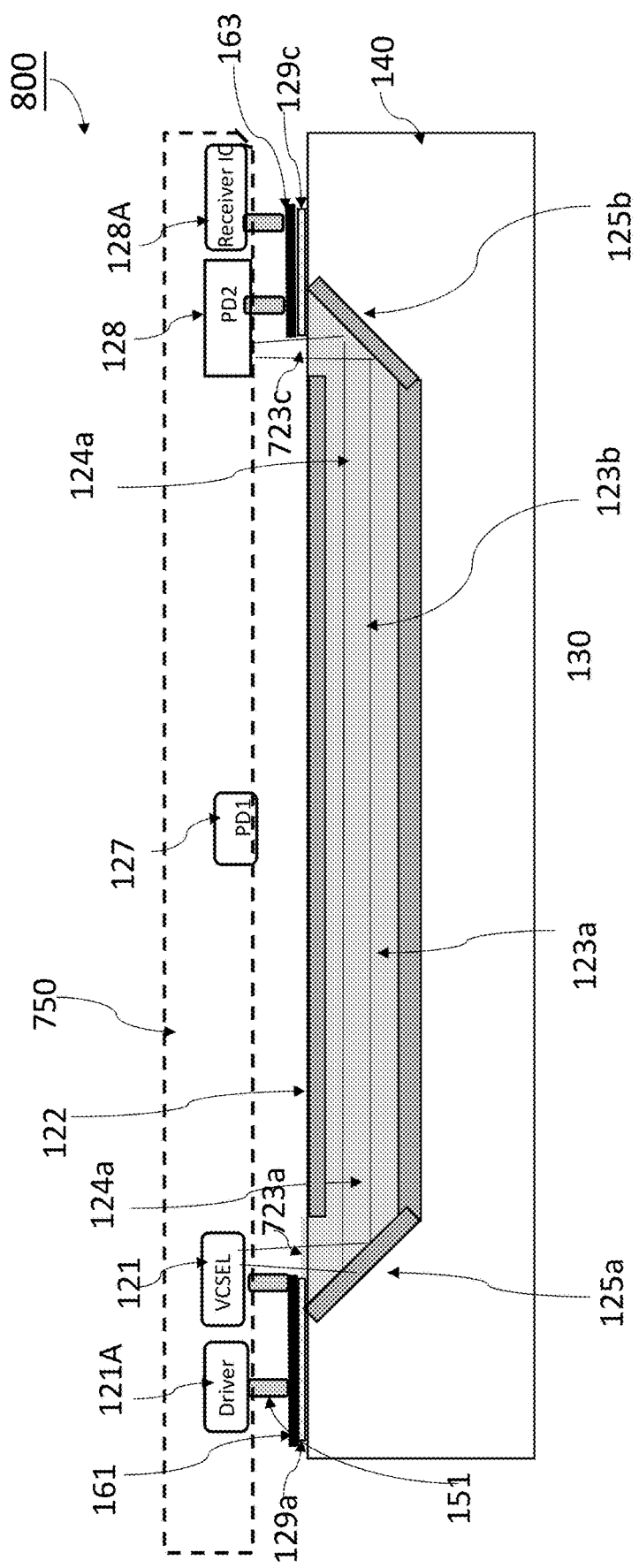

FIG. 8 illustrates a cross sectional view of an optical splitter having a polymer waveguide in the silicon trench along the line BB' in FIG. 7 in accordance with an embodiment.

Figure 9:
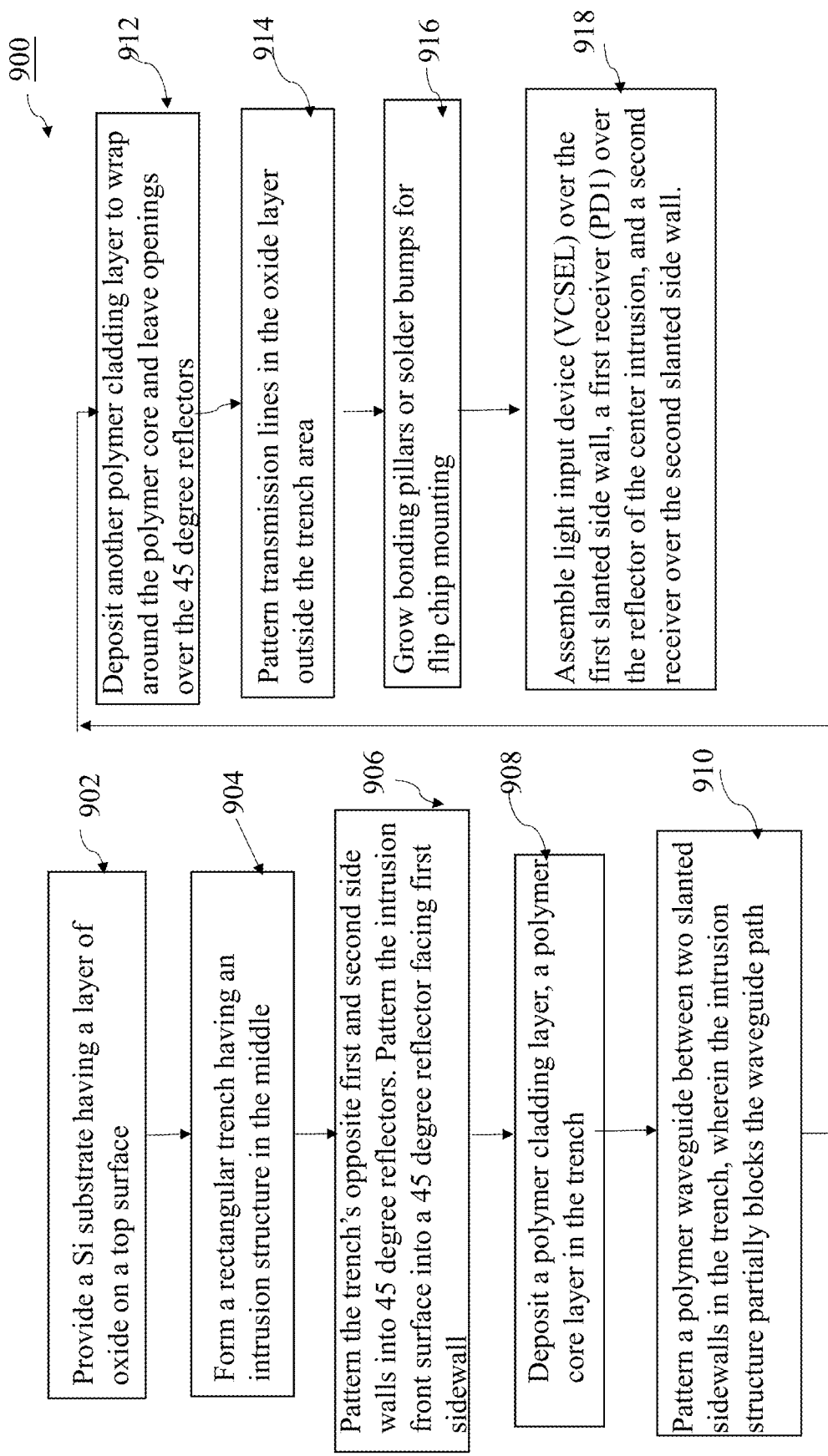

FIG. 9 shows a flow chart disclosing an examplenary method for fabricating an optical splitter having a polymer waveguide interconnected with a transmitter and two receivers from the same surface of a silicon substrate in accordance with the disclosed embodiment.

Figure 10:
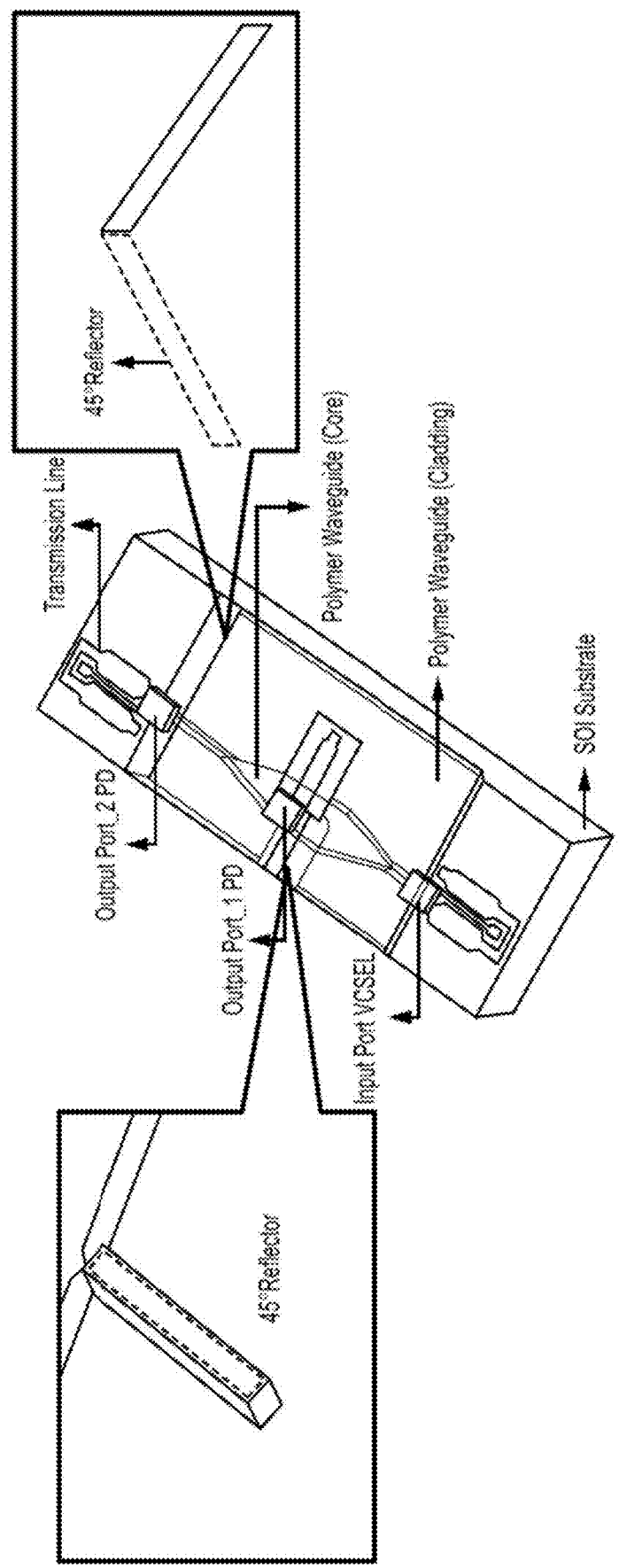

FIG. 10 illustrates a schematic diagram of an optical splitter sample having a polymer waveguide which has been reduced to practice, in accordance with the disclosed embodiment.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Optical interconnect is a means of communication by optical modules. Optical communication systems often apply a vertical-cavity surface-emitting laser VCSEL for convenient configurations and easy assembling.

The vertical-cavity surface-emitting laser, or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Vertical cavity self-emitting laser or VCSEL laser emitting light at wavelengths from 650 nm to 1300 nm are typically based on gallium arsenide (GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as an organic film like polyimide or a non-conductive film (NCF), may also be applied to enhance adhesion of the components to the silicon substrate. The high speed conductive lines, including an RF transmission devices, are designed on the same surface as the polymer waveguides to connect the driver IC and VCSEL arrays as well as to connect trans-impedance amplifier (TIA) arrays. Typically a VCSEL array has four VCSEL lasers packed in a row.

In accordance with an embodiment, the data rate of the optical engine can be operated at 25 Giga-bits per second (Gbps) per channel, and can be extended to higher data rates such as 50 Gbps per channel. VCSEL applications include fiber optic communications, precision sensing, computer mice and laser printers.

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. Assembly time can be reduced compared to conventional techniques through use of semiconductor process technologies for the formation of conductive transmission lines and flip chip integration of the active optical devices such as the driver IC chip, lasers, PD, and receiver (e.g. TIA) chips. In addition, the fabrication techniques may allow for improved RF performance of the electrical signals and increased data rates of the optical interconnects. The embodiments illustrated below may be integrated as a PCB-based optical interconnect. In particular, the embodiment may be utilized to improve optical coupling with the VCSEL/PD by monolithically integrating a silicon wafer interposer with a VCSEL laser within a packaging platform like PCB, and a polymer waveguide.

As shown in FIG. 1, substrate 100 has a silicon surface 140 which includes a few insulating areas. Exemplarily the substrate 100 can be a silicon wafer or silicon-on-insulator (SOI) wafer. In the case of SOI substrate, the top silicon is removed in the few insulating areas. The thickness of the silicon substrate 140 is chosen to be thin so it is light and yet has enough strength to support photonics elements on the top surface during its fabrication process and in its long term operation. Typically the thickness is in the range of 50 microns to 2 millimeters. Insulation areas 129a, 129b and 129c are patterned oxide, nitride, which will be the isolated non-conductive bases for building photo electronic devices on. If a SOI wafer is used, the surface silicon layer is removed from the embedded oxide.

FIG. 2 shows a top view 200 of a trench having two slanted side walls and an upward intrusion structure having one slanted front wall made on the silicon substrate in accordance with an embodiment. The trench 130 has an elongated shape, likely a rectangular. The length of the trench 130 accommodates the length of the polymer waveguide which will be fabricated inside. The width of the trench 130 allows the full waveguide to be packed inside the trench. The depth of the trench 130 allows to accommodate at least the full package of the polymer waveguide. This depth can vary from a few microns to one millimeter. The opposite side walls 125a and 125b are built as slanted slopes upon which the ends of the polymer waveguide lie. The upward intrusion structure 120 has three parts: the front surface 120a facing the first end slope 125a is a slanted surface. The intrusion structure's back surface 120b does not have to be made into a slanted slope if no reverse device is applied here. There is a connecting part between the two surfaces. The intrusion structure is located near the middle of in the long direction of the trench, and occupies a space partially along the short direction of the trench. The height of the intrusion is similar to the depth of the trench. The slanted angles of the two side walls 125a and 125b and the front surface 120a of the intrusion are set nearly at 45 degrees in order to easily align with the light source and the optical receivers. However, the three slanted angles don't have to be the same, but should be set close to but not necessarily exactly 45 degrees. In the following description, the slanted angle is referred to as 45 degrees for exemplary reasons. To make the elongated trench and the slanted surfaces, a number of patterning techniques can be applied. Photolithography commonly applied in CMOS process technology provides various ways in controlling the lithography exposure energy to achieve smooth and accurate slanted slopes. For example, a moving exposure shutter or a shrinking window during photo-exposure or a variable scanner light intensity during exposure are available techniques. Precise reflector angle control and low surface roughness are critical to optical energy efficiency, therefore fabrication in this step should have appropriate requirements.

FIG. 3 shows a top view 300 of a polymer waveguide core structure formed in the silicon trench in accordance with an embodiment.

An optical passive path formation is disclosed, i.e. making the polymer waveguide, inside the trench 130. Although in many optical interconnect modules, a waveguide may be formed separately first and attached to one surface of a substrate later, using an adhesive layer, this application discloses a polymer waveguide fabricated directly on the silicon substrate. As an integrated part of the substrate, the polymer waveguide enables low optical coupling loss at interfaces and stable alignment along the optical path. Meanwhile, fabrication cost from attaching waveguides to an interposer is much reduced. The polymer waveguide is formed in the trench which typically includes a polymer cladding layer at the bottom having a thickness in the range of one to 50 microns and a polymer core layer on top of the polymer cladding layer. The polymer core has a thickness ranging from a few microns for single mode light to hundreds of microns for multi-mode waveguides. It is also possible to deposit only one layer of polymer as the core without a special cladding layer if there is sufficient total internal reflection without the cladding layer. However thus produced polymer waveguide may not be optically efficient. Silicon and oxide both have higher fraction index than most optical polymer materials. Therefore a cladding shielded polymer waveguide is preferred on a silicon or SOI substrate. Polymers include PMMA, polyimide, and other optical quality polymer materials. It typically applies two polymer materials for core and for cladding which have distinguishable refractive indices at the working wavelengths. Cladding generally is made of silicone (index ~1.46), and core is made of PMMA or polyimide which has index in range of 1.49 and 1.59. The slanted trench side walls 125a and 125b and the slanted front surface 120a of the intrusion structure 120 in the middle of the waveguide are covered at least partially by the bottom cladding layer and the core layer. The polymer waveguide typically includes four sections, two straight waveguides 124a and 124b, and two middle sections 123a and 123b. The waveguide's straight sections 124a and 124b connect to the trench's slanted side walls 125a and 125b. The waveguide therefore terminates with two 45 degree end reflectors. The middle sections 123a and 123b are seamlessly connected end to end with each other at the inner ends and with the straight sections 124a and 124b at the outer ends. The waveguide's middle portions 123a and 123b are blocked by the intrusion structure 120 partially. Therefore, the intrusion's slanted front surface 120a enables a reflective surface inside the waveguide middle portion 123a. The intrusion structure 120 does not block the full path of the waveguide completely, so the light not blocked by the intrusion continues to travel down the waveguide. This optical splitter built on the reflective surface in waveguide 123a reflects the blocked light and passes the remaining. The exact splitting ratio of the splitter depends on relative size of the reflecting surface and the cross section of the waveguide near the intrusion structure, the surface reflecting efficiency. Often the waveguide is made wider near the intruder 120 to provide better control of the splitting ratio.

The slanted reflecting surfaces must meet high optical quality requirements such as good high frequency roughness, low light scattering and accurate angle control. Patterning techniques include lithography and laser writing. Each polymer section has a width around 4-6 microns for a single mode waveguide, or in a range of 10 microns to hundreds of microns for a multi-mode waveguide. This patterning step is performed using lithography technique and selective etch so the polymer is removed but the underlining silicon is intact.

FIG. 4 illustrates a top view diagram of a polymer cladding layer deposited on the polymer waveguide core in the silicon trench in accordance with an embodiment. To complete the waveguide, a cladding layer 122 is deposited on top of the polymer core sections, only to leave open the optical path, i.e., those areas directly above the slanted side walls and the intrusion front wall. The cladding applies a different polymer material than the core and should be deposited below the core polymer layer and also deposited on and around the core waveguide. The same polymer cladding material is preferably disposed wrapping around the waveguide core on its bottom surface, top surface, side walls, and the slanted interfaces in order to have uniformly matched refractive index difference.

If no designated cladding layer is included in the polymer waveguide, it is recommended to seal the waveguide hermetically with a stable material to protect the waveguides from environmental degradation. The passivating layer should have a refractive index lower than that of the polymer core to guarantee total light internal reflection.

FIG. 5 illustrates a top view of an optical splitter using a polymer waveguide after contact lines and active devices have been fabricated outside the silicon trench, wherein a line AA' is drawn through the intrusion structure in accordance with an embodiment.

As shown in FIG. 5, diagram 500 has a silicon substrate 140, a silicon trench 130 opens a space for disposing the polymer waveguide sections 124a, 123a, 123b, and 124b, and the intrusion structure 120 inside the trench.

As shown in FIG. 5, conductive lines are formed over the top silicon surface outside the trench. Because silicon is a semiconductor, all conductive lines 161, 162, and 163 are formed in insulating films 129a, 128b, and 129c. Conductive lines 161 are formed on the left side of the trench to connect to optical input devices such as a VCSEL 121 and its driver 121A. Conductive lines 162 are formed near the middle of the trench close to the intrusion structure to connect to the first receiver photodetector PD1 127 and its receiver IC circuit 127A. Conductive lines 163 are formed on the right side of the trench for optic output devices such as the second receiver PD2 128 and its receiver IC circuit 128A.

The insulating films 129a, 128b, and 129c are either deposited or grown on the silicon surface outside the trench 130. Polymer waveguide in the trench is located on the same surface of the substrate as the electronic devices, so there will be no device disposed on the other side of the silicon substrate. The waveguides are fabricated together with interconnecting the optical devices, thus there will be no bonding step to integrate a separate waveguide. During fabrication, there is a risk to damage the devices on the work piece from the holder stage if the work piece has to be flipped over. With this disclosed technique, the process does not have a substrate flip-over step to change the working surface, therefore fabrication is more straightforward and less risky.

Conductive lines perform the function of high speed transmission lines. Metals like copper, aluminum, tungsten, titanium, stainless steel, or alloys can be chosen for transmission lines. Metal layer deposition techniques known in the semiconductor industry such as sputtering of metal, followed by wet/dry etch, direct deposition, metal plating, or laser writing. Other line forming techniques can also be applied. For example, trenches can be first formed into the top surface of the insulating layer; a metal layer then is deposited on the trenches, followed by a planarization technique like chemical mechanical polishing (CMP) or selective dry/wet etching to remove the excess metal from areas outside the trenches. In accordance with the embodiments, formation of the conductive lines 161, 162 and 163 on the substrate may lead to improved RF signal performance from the high dielectric constant of the silicon material, typically ranging in 3 to 4 for infrared light. The resultant data rate of the optical device goes up to 25 Giga-bits per second (Gbps) per channel, and can be extended to even higher data rates such as 50 Gbps per channel.

In FIG. 5 a line AA' is drawn along the polymer waveguide passing through the intrusion structure. In FIG. 7 a line BB' is drawn along the polymer waveguide outside the intrusion structure. The first receiver 127 aligns to the reflector on the front surface of intrusion structure (splitter) and receives the reflected light from the reflector.

FIG. 6 illustrates a cross sectional view of an optical splitter having a polymer waveguide in the silicon trench along the line AA' in FIG. 5 in accordance with an embodiment. FIG. 8 illustrates a cross sectional view of an optical splitter having a polymer waveguide in the silicon trench along the line BB' in FIG. 7 in accordance with an embodiment.

As shown in FIG. 6 and FIG. 8, bonding pillars or solder bumps 151 (not all are labeled) connect the conducting lines 161, 162, 163 to active electronic devices (VCSEL, PD1, PD2, drivers, receiver IC).

The active and other electronic devices maybe assembled via chip bonding to pads on a PCB unit 150 attached to the silicon substrate. As stated above, direct patterned conductive lines (also named as transmission lines or electronic traces) on the same surface of the substrate enables high speed performance.

FIG. 6 shows the optical path through the splitter 120 along the line AA' in FIG. 5. The VCSEL laser output beam is aligned to match the first 45 degree end reflector 125a along path 723a. The laser beam travels through the clad-free opening, changes trajectory by 90 degrees by the end reflector 125a which couples light beam to the straight section of waveguides 124a and the middle section 123a. Light is reflected off the reflector 120a on the intrusion, which is aligned to the first receiver photodetector PD1 127. The reflector on intrusion 120a blocks part of the laser beam, which disappears at the back side of the intrusion in the middle section 123b and reappears as the cross section cutline AA' bends back to the center axis of the straight section 124b of the polymer waveguide.

FIG. 8 shows the optical path bypassing the splitter 120 along the line BB' in FIG. 7. The optical path is similar to that in FIG. 6 in the front part. The laser beam travels through the clad-free opening, changes trajectory by 90 degrees by the end reflector 125a which couples light beam to the straight section of waveguides 124a. Laser beam then travels along the middle section 123a bypassing the intrusion structure 120 at its side, so there is no light split off into the first receiver 127 in this optical path. Then light travels through 123b and 124b to the end of the polymer waveguide and gets reflected by the second 45 degree reflector 125b, changes trajectory 90 digress again, passes along path 723b back into the second receiver (photodetector) 128, thus completing the full optical path as shown in FIG. 8.

The completed optical interconnect system rests on the silicon substrate 140 which provides a mechanical support structure for a PCB or FCB 150 on which other bonding pads and external form factors may reside. Without the silicon substrate as an interposer, it may be too fragile to depend on PCB film to hold the photonic devices and the arrays of waveguides during manufacturing and in long term operation. A metal plate can be attached to the silicon substrate to provide additional mechanical strength. The metal plate may be made of stainless steel and electrically grounded. The metal plate should have windows open to the light beams.

In another embodiment, a metal plate is attached to the silicon substrate to provide additional mechanical strength. The metal plate can be made of stainless steel and electrically grounded. The metal plate should have windows open to the light beams.

FIG. 9 shows a flow chart 900 disclosing an examplenary method for fabricating an optical splitter having a polymer waveguide interconnected with a transmitter and two receivers from the same surface of a silicon substrate in accordance with the disclosed embodiment.

The fabrication sequence may include the first step 902, provide a Si substrate having a layer of insulating material on a top surface. The insulating material may be oxide, nitride, glass, etc. being deposited on the silicon surface to form base for electronic device interconnections. In step 904, form a rectangular trench having an intrusion structure in the middle of the trench. In step 906, pattern the trench's opposite first and second side walls into 45 degree reflectors. The slanted first and second sidewalls are opposite to each other. Pattern the intrusion's front surface into a 45 degree reflector facing the first sidewall. The slanted angles of the first and second sidewalls form a desired optical path, it is exemplary 45 degrees for both but they are not necessarily the same and they don't have to be 45 degrees.

To make the elongated trench and the slanted side walls, a number of ways in controlling the lithography exposure energy can be applied to achieve smooth and accurate slant slopes. For example, a moving exposure shutter or a shrinking window during photo-exposure or a variable scanner light intensity during exposure are available techniques. Reflector angle control tolerance and surface smoothness are critical to optical path efficiency, therefore fabrication of this step should have appropriate speciation requirements. Advanced micro patterning technology can provide such capability today.

In step 908, deposit a polymer layer in the trench, covering part of the slanted slopes. If a core polymer layer and a cladding polymer layer are desired, first deposit the cladding polymer at the bottom of the trench and the slanted slope, then cover the cladding polymer layer with the core polymer layer. Deposit a second polymer cladding layer on the polymer waveguides. The width of each waveguide can be from 5 microns for a single mode waveguide to a large one up to 500 microns for a multi-mode waveguide. The ends of the waveguide rest on the slanted sidewalls of the silicon trench, forming reflectors. If a cladding layer is desired, deposit the second cladding layer to wrap around the waveguide. In step 910, pattern a polymer waveguide between two slanted sidewalls in the trench, wherein the intrusion structure partially blocks the waveguide path. In step 912, deposit another polymer cladding layer on top to wrap around the polymer core and leave openings in top clad over the 45 degree reflectors. To allow an optical path, one opening above each of the first, the second, and the third reflectors should be arranged.

In step 914, pattern transmission lines in the oxide layer outside the trench area. One way to form transmission lines is to pattern trenches on insulating layer and fill in metal to form transmission lines, or another way is to deposit metal layer and pattern it into lines with etching or Laser writing. The metal layer may be aluminum, tungsten, stainless steel, etc. If it is copper, process will need to follow copper electro-plating techniques. In step 916, grow bonding pillars or solder bumps with Au/Ni coatings on the conductive lines. In step 918, assemble light input device (VCSEL) over the first slanted side wall, a first receiver (PD1) over the reflector of the center intrusion, and a second receiver (PD2) over the second slanted side wall for flip chip mounting with bond pads on a PCB or FCB board.

FIG. 10 shows a picture of a sample, which has been reduced to practice, which is a 1×2 optical splitter using polymer waveguide, in accordance with the disclosed embodiment.

However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical splitter module, comprising:
a substrate having a top silicon surface;
a trench formed on the top silicon surface, wherein the trench comprises a first and a second slanted side walls at two ends of the trench opposite to each other, and an intrusion structure at approximately a middle of the trench, wherein the intrusion structure has a slanted front wall facing the first slanted side wall and a slanted back wall facing the second slanted side wall, wherein the intrusion structure leaves an opening at side for light to pass between the first and second slanted side walls;
a polymer waveguide formed in the trench, wherein the polymer waveguide comprises a first reflector formed on the first slanted side wall, a second reflector formed on the second slanted side wall, and a third reflector formed on the slanted front wall of the intrusion structure;
an insulating layer disposed on the silicon surface outside the trench;
a plurality of conductive lines patterned on the insulating layer;
a light source device aligned to the first reflector and connected to a first of the plurality of conductive lines;
a first optical receiver device aligned to the third reflector on the intrusion structure and connected to a third of the plurality of conductive lines; and
a second optical receiver device aligned to the second reflector and connected to a second of the plurality of conductive lines;
wherein an optical path comprises a first portion and a second portion, wherein the first portion passes from the light source device through the polymer waveguide to the first optical receiver device, via reflection by the first reflector on the first slanted side wall and the third reflector on the intrusion structure, and wherein the second portion passes from the light source device through the polymer waveguide to the second optical receiver device, via reflection by the first and the second reflectors; and wherein a size of the intrusion structure is predetermined based on the light splitting ratio received by the first and second optical receivers and a size ratio of the third reflector relative to the size of a cross section of the polymer waveguide near the intrusion structure.

2. The optical splitter module of claim 1, wherein the polymer waveguide includes a first polymer cladding layer disposed on the trench's bottom covering the first and second slanted side walls and the front slanted surface of the intrusion structure, and a polymer core layer disposed on the polymer cladding layer, a second polymer cladding layer over the polymer core layer; wherein a refractive index of the first and second polymer cladding layers is lower than a refractive index of the polymer core layer such that total internal reflection occurs when light travels inside the polymer waveguides.

3. The optical splitter module of claim 1, wherein the first slanted side wall of the trench has a slanted angle approximately set at 45 degrees to align optically to the light source device, wherein the second slanted side wall of the trench has a slanted angle approximately set at 45 degrees to align optically to the second optical receiver device, and wherein the slanted front wall of the intrusion structure has a slanted angle approximately set at 45 degrees to align optically to the first optical receiver device.

4. The optical splitter module of claim 1, wherein the light source device comprises a vertical cavity surface emission laser (VCSEL), or a vertical cavity surface emission laser array (VCSELs) emitting infrared light.

5. The optical splitter module of claim 1, wherein the first and second optical receiver devices are photodiodes (PD).

6. The optical splitter module of claim 1, wherein the light source device further comprises an IC driver, wherein the optical receiver device further comprises an IC driver and amplifier.

7. The optical splitter module of claim 1, wherein the light source device, the first and second optical receiver devices are respectively connected to the plurality of conductive lines by solder bumps with Au/Ni coatings.

8. The optical splitter module of claim 1, wherein the polymer waveguide has a width wider near the intrusion structure than away from the intrusion structure.

9. The optical splitter module of claim 1, wherein the plurality of conductive lines is made of one of tungsten (W), aluminum (Al), copper (Cu), gold (Au), silver (Ag), stainless steel, or an alloy.

10. The optical splitter module of claim 1, wherein the plurality of conductive lines is high speed RF transmission lines capable of operating at 25 Gbps per channel.

11. The optical splitter module of claim 1, wherein a fourth reflector is formed on the slanted back wall of the intrusion structure.

12. A method of fabricating an optical splitter module, according to claim 1, comprising:
providing the substrate having the insulating layer on the top surface;
determining the desired light splitting ratio received by the first and second optical receivers;
forming the trench having the intrusion structure in the trench;
patterning the first and the second slanted side walls at two ends of the trench, wherein the first and second slanted sidewalls are opposite to each other; wherein the intrusion structure leaves an opening for light to pass between the first and second slanted side walls, wherein a size ratio of the intrusion structure relative to the size of a cross section of the trench near the intrusion structure is based on the desired light splitting ratio;
patterning the slanted front surface of the intrusion structure facing the first slanted side wall and the back surface facing the second slanted side wall;
forming the polymer waveguide in the trench, comprising:
depositing a first polymer cladding layer in the trench covering the first and second slanted side walls, and the slanted front wall of the intrusion structure;
depositing a polymer core layer on the first polymer cladding layer;
patterning the polymer core layer between the first and second slanted side walls to form the first, the second reflectors respectively, and patterning the intrusion structure to form the third reflector on the slanted front surface, wherein the intrusion structure partially blocks the polymer waveguide;
covering the patterned polymer core layer with a second polymer cladding layer, leaving one opening above each of the first, the second, and the third reflectors;
patterning conductive lines in the insulating layer outside the trench;
growing solder bumps with Au/Ni coatings on conductive lines for flip chip mounting with bond pads; and
assembling the light source device to align to the first reflector, the first optical receiver device to align to the third reflector of the intrusion structure, and the second optical receiver device to align to the second reflector.

13. The method of fabricating the optical splitter module in claim 12, wherein the light source device comprises a vertical cavity surface emitting laser (VCSEL) and wherein the first and second optical receiver devices comprise photodetectors (PD).

14. The method of fabricating the optical splitter module in claim 12, wherein patterning the first and second slanted side walls of the trench and the slanted front wall of the intrusion structure comprises applying a variable lithography exposure energy to achieve low roughness and accurate slanted angles.

15. The method of fabricating the optical splitter module in claim 12, wherein the first, second and third reflectors have approximately 45 degree slanted angles.

16. The method of fabricating the optical splitter module in claim 12, wherein patterning the conductive lines comprises forming grooves and filling in a metal in the grooves, followed by removing excess metal by polishing (CMP) or by selective etch to clean up metal outside the grooves.

17. The method of fabricating the optical splitter module in claim 12, wherein patterning the conductive lines comprises depositing a metal, patterning the metal layer into lines by selective etch, electroplating, or laser writing.

18. The method of fabricating the optical splitter module in claim 12, wherein the conductive lines include metal materials: aluminum, copper, tungsten, or stainless steel.

19. The method of fabricating the optical splitter module in claim 12, wherein the back surface of the intrusion structure is slanted.

* * * * *